United States Patent
Bu et al.

(10) Patent No.: US 7,148,143 B2
(45) Date of Patent: Dec. 12, 2006

(54) SEMICONDUCTOR DEVICE HAVING A FULLY SILICIDED GATE ELECTRODE AND METHOD OF MANUFACTURE THEREFOR

(75) Inventors: Haowen Bu, Plano, TX (US); Jiong-Ping Lu, Richardson, TX (US); Shaofeng Yu, Plano, TX (US); Ping Jiang, Plano, TX (US); Clint Montgomery, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 114 days.

(21) Appl. No.: 10/808,168

(22) Filed: Mar. 24, 2004

(65) Prior Publication Data

US 2005/0215055 A1    Sep. 29, 2005

(51) Int. Cl.
*H01L 21/44* (2006.01)
*H01L 21/4763* (2006.01)
*H01L 21/461* (2006.01)
*H01L 21/302* (2006.01)

(52) U.S. Cl. .............. 438/682; 438/664; 438/655; 438/649; 438/669; 438/721; 438/583; 438/300; 438/230; 438/618; 438/744; 438/791; 438/199; 257/536; 257/E21.166

(58) Field of Classification Search .............. 438/669, 438/618, 744, 791, 682, 664, 655, 649, 721, 438/199, 583; 257/536
See application file for complete search history.

(56) References Cited

U.S. PATENT DOCUMENTS

| | | | |
|---|---|---|---|
| 6,326,291 B1 * | 12/2001 | Yu | 438/592 |
| 6,391,710 B1 | 5/2002 | Moore et al. | |
| 6,794,313 B1 * | 9/2004 | Chang | 438/770 |
| 2001/0034129 A1 * | 10/2001 | Moore et al. | 438/689 |
| 2004/0259303 A1 * | 12/2004 | Lee et al. | 438/232 |
| 2005/0179098 A1 * | 8/2005 | Chan et al. | 257/412 |

\* cited by examiner

*Primary Examiner*—Michael Lebentritt
*Assistant Examiner*—Mohsen Ahmadi
(74) *Attorney, Agent, or Firm*—Peter K. McLarty; W. James Brady, III; Frederick J. Telecky, Jr.

(57) ABSTRACT

The present invention provides a semiconductor device, a method of manufacture therefor, and a method for manufacturing an integrated circuit. The semiconductor device (100), among other possible elements, includes a silicided gate electrode (150) located over a substrate (110), the silicided gate electrode (150) having gate sidewall spacers (160) located on sidewalls thereof. The semiconductor device (100) further includes source/drain regions (170) located in the substrate (110) proximate the silicided gate electrode (150), and silicided source/drain regions (180) located in the source/drain regions (170) and at least partially under the gate sidewall spacers (160).

18 Claims, 14 Drawing Sheets

SEMICONDUCTOR DEVICE HAVING A FULLY SILICIDED GATE ELECTRODE AND METHOD OF MANUFACTURE THEREFOR

TECHNICAL FIELD OF THE INVENTION

The present invention is directed, in general, to a semiconductor device and, more specifically, to a semiconductor device having a fully silicided gate electrode, a method of manufacture therefor, and an integrated circuit including the same.

BACKGROUND OF THE INVENTION

Metal gate electrodes are currently being investigated to replace polysilicon gate electrodes in today's ever shrinking and changing transistor devices. One of the principle reasons the industry is investigating replacing the polysilicon gate electrodes with metal gate electrodes is in order to solve problems of poly-depletion effects and boron penetration for future CMOS devices. Traditionally, a polysilicon gate electrode with an overlying silicide was used for the gate electrodes in CMOS devices. However, as device feature size continues to shrink, poly depletion becomes a serious issue when using polysilicon gate electrodes.

Accordingly, metal gates have been proposed. However, in order to optimize the threshold voltage ($V_t$) in CMOS devices, the metal gates need dual tunable work functions. For instance, the metal gates need tunable work functions for NMOS and PMOS devices similar to present polysilicon gate technology, requiring the work functions of metal gates to range from 4.1~4.4 eV for NMOS and 4.8~5.1 eV for PMOS (see, B. Cheng, B. Maiti, S. Samayedam, J. Grant, B. Taylor, P. Tobin, J. Mogab, IEEE *Intl. SOI Conf. Proc.*, pp. 91–92, 2001).

Recently, silicided metal gates have been investigated based on the extension of existing self-aligned silicide (SALICIDE) technology. In this approach, polysilicon is deposited over the gate dielectric. A metal is deposited over the polysilicon and reacted to completely consume the polysilicon resulting in a fully silicided metal gate, rather than a deposited metal gate. The silicided metal gate provides a metal gate with the least perturbation to the conventional process and avoids contamination issues. Furthermore, poly doping has been shown to affect the work function of the silicided metal gates.

The silicided metal gates are not without their problems. One of the more significant problems associated with the silicided metal gates is attributed to the simultaneous formation of the silicided metal gate and the silicided source/drain regions. When formed simultaneously, the depth of the silicided source/drain regions is directly proportional to the thickness of the polysilicon gate electrode. As the polysilicon gate electrodes currently range in thickness from about 60 nm to about 120 nm, the silicided source/drain regions ultimately extend into the silicon substrate by up to about 60 nm to about 120 nm, respectively. Deep silicided source/drain regions are nonetheless undesireable.

Various companies in the industry have attempted to separate the silicidation of the polysilicon gate and the silicidation of the source/drain regions. Those companies employ chemical mechanical polishing (CMP) technology to separate the steps. In such integration schemes, the gate electrode is masked by a silicon oxide layer and a silicide is then formed on the source/drain regions. Next, a blanket dielectric layer is deposited over the gate stack and silicided source/drain regions. The CMP process is then employed to expose the gate electrode for silicidation, while the source/drain regions are covered by the protective dielectric layer. The main drawback of this approach originates from the across-wafer non-uniformity inherently associated with polishing (such as dishing, etc.). In addition, the poly height on the active area may be different from the designed poly height. As a result, the height of the poly gate after polishing may suffer significant variation. Therefore, the silicidation may be inconsistent across-wafer, and/or wafer-to-wafer due to the thickness variation in poly-gate.

Accordingly, what is needed is a method for manufacturing silicided metal gate structures separate from the silicided source/drain regions that does not experience the drawbacks of the prior art methods.

SUMMARY OF THE INVENTION

To address the above-discussed deficiencies of the prior art, the present invention provides a semiconductor device, a method of manufacture therefor, and a method for manufacturing an integrated circuit. The semiconductor device, among other possible elements, includes a silicided gate electrode located over a substrate, the silicided gate electrode having gate sidewall spacers located on sidewalls thereof. The semiconductor device further includes source/drain regions located in the substrate proximate the silicided gate electrode, and silicided source/drain regions located in the source/drain regions and at least partially under the gate sidewall spacers.

The present invention further includes a method for manufacturing a semiconductor device. The method includes forming a protective layer over a polysilicon gate electrode located over a substrate to provide a capped polysilicon gate electrode and then forming source/drain regions in the substrate proximate the capped polysilicon gate electrode. The method further includes removing the protective layer using an etchant, siliciding the polysilicon gate electrode to form a silicided gate electrode, and siliciding the source/drain regions.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
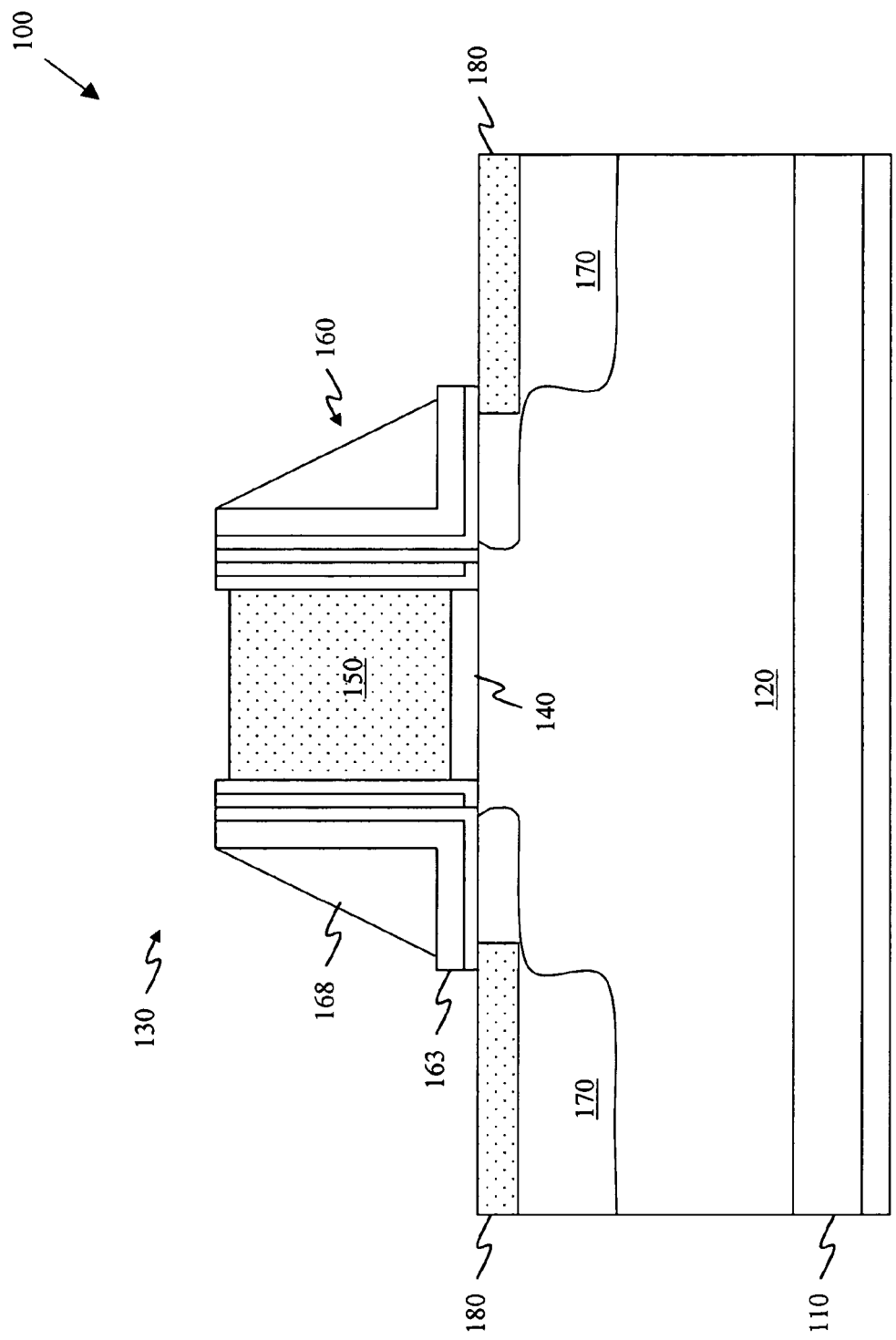
FIG. 1 illustrates a cross-sectional view of one embodiment of a semiconductor device constructed according to the principles of the present invention.

Referring initially to FIG. 1, illustrated is a cross-sectional view of one embodiment of a semiconductor device 100 constructed according to the principles of the present invention. In the embodiment illustrated in FIG. 1, the semiconductor device 100 includes a substrate 110. Located within the substrate 110 in the embodiment of FIG. 1 is a well region 120. Additionally located over the substrate 110 and well region 120 is a gate structure 130.

The gate structure 130 illustrated in FIG. 1 includes a gate oxide 140 located over the substrate 110, as well as a fully silicided gate electrode 150 located over the gate oxide 140. The silicided gate electrode 150 may have a variety of thicknesses, nonetheless, a thickness ranging from about 50 nm to about 150 nm is exemplary. The silicided gate electrode 150, when constructed in accordance with the principles of the present invention, may comprise a number of different materials. For instance, in the illustrative embodiment shown in FIG. 1 the silicided gate electrode 150 comprises nickel, however, it is envisioned that the silicided gate electrode 150 could comprise cobalt, platinum, titanium, tantalum, molybdenum, tungsten, etc., while staying within the scope of the present invention.

The silicided gate electrode 150 may also include a dopant or combination of several types of dopants therein. The dopant, such as boron, phosphorous, arsenic or another similar dopant based on whether the semiconductor device 100 is operating as a PMOS device or an NMOS device, is configured to tune the minimum energy required to bring an electron from the Fermi level to the vacuum level, or the so called work function.

The gate structure 130 further contains gate sidewall spacers 160 flanking both sides of the silicided gate electrode 150 and gate oxide 140. The gate sidewall spacers 160 in the embodiment of FIG. 1 each include a number of different layers. For instance the gate sidewall spacers 160, among other layers, each include L-shaped nitride spacers 163 and sidewall oxides 168. In this particular embodiment the L-shaped nitride spacers 163 comprise a unique nitride layer that includes carbon. The carbon content may be within a wide range, however, it is believed that a carbon content ranging from about 5% to about 10% is advantageous. The other layers, among other materials, could include a collection of oxides and nitrides. The gate sidewall spacers 160 may comprise many different types and numbers of layers while staying consistent with the principles of the present invention.

The semiconductor device 100 illustrated in FIG. 1 additionally includes conventional source/drain regions 170 located within the substrate 110 and proximate the gate oxide 140. Located within the source/drain regions 170 are silicided source/drain contact regions 180. The silicided source/drain contact regions 180 in this embodiment comprise nickel silicided source/drain contact regions 180. Nonetheless, other silicidation materials could be used to form the silicided source/drain regions 180 and remain within the scope of the present invention. The silicided source/drain contact regions 180 may have a depth into the source/drain regions 170 ranging from about 10 nm to about 30 nm, among others. Additionally, unique to the present invention, the silicided source/drain contact regions 180 may be located from about 2 nm to about 10 nm under the gate sidewall spacers 160. This unique feature is due at least in part to the novel method used to form the semiconductor device 100.

Figure 2:
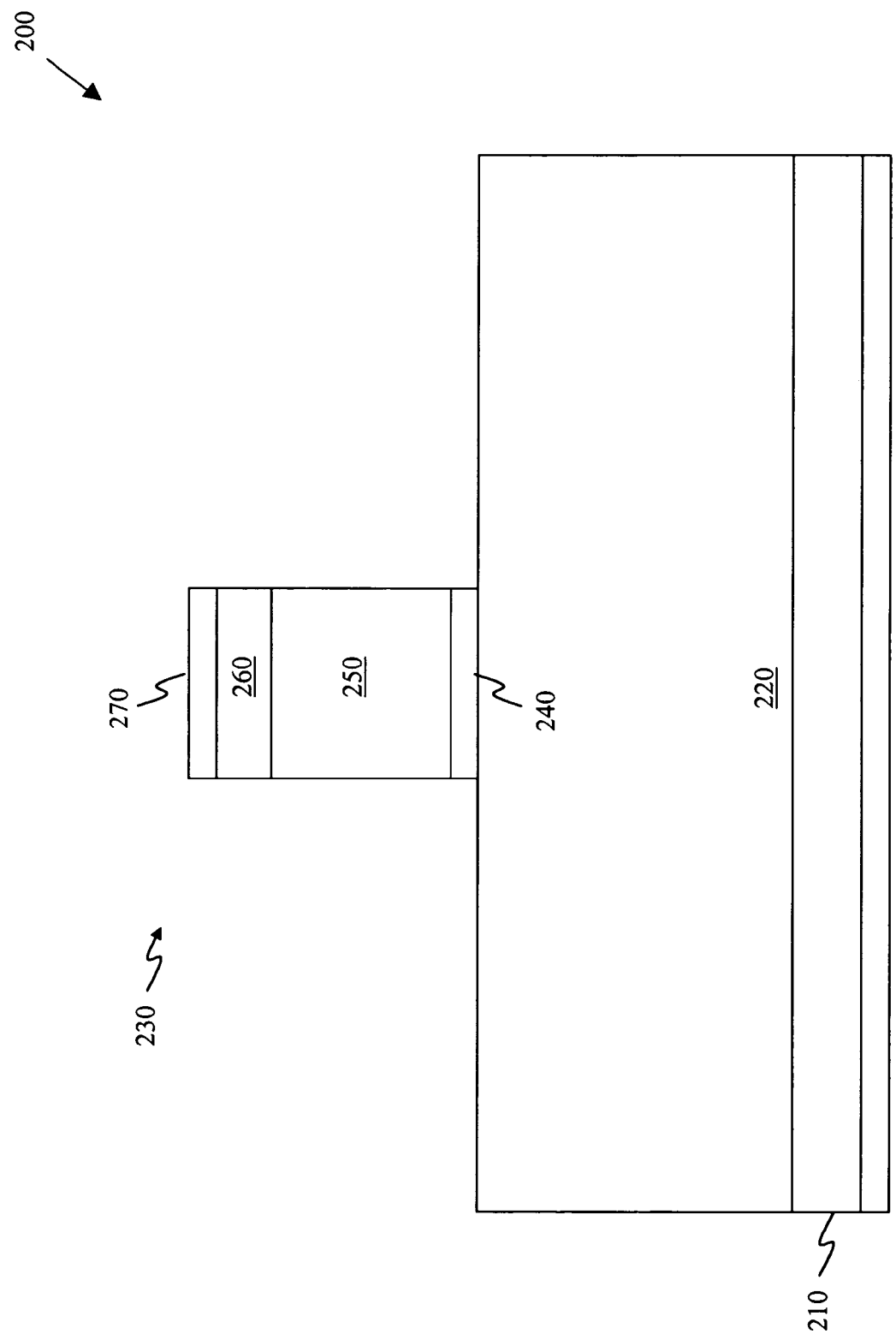
FIG. 2 illustrates a cross-sectional view of a partially completed semiconductor device manufactured in accordance with the principles of the present invention.

Turning now to FIGS. 2–12, illustrated are cross-sectional views of detailed manufacturing steps instructing how one might, in an advantageous embodiment, manufacture a semiconductor device similar to the semiconductor device 100 depicted in FIG. 1. FIG. 2 illustrates a cross-sectional view of a partially completed semiconductor device 200 manufactured in accordance with the principles of the present invention. The partially completed semiconductor device 200 of FIG. 2 includes a substrate 210. The substrate 210 may, in an exemplary embodiment, be any layer located in the partially completed semiconductor device 200, including a wafer itself or a layer located above the wafer (e.g., epitaxial layer). In the embodiment illustrated in FIG. 2, the substrate 210 is a P-type substrate; however, one skilled in the art understands that the substrate 210 could be an N-type substrate without departing from the scope of the present invention. In such a case, each of the dopant types described throughout the remainder of this document would be reversed. For clarity, no further reference to this opposite scheme will be discussed.

Located within the substrate 210 in the embodiment shown in FIG. 2 is a well region 220. The well region 220, in light of the P-type semiconductor substrate 210, would more than likely contain an N-type dopant. For example, the well region 220 would likely be doped with an N-type dopant dose ranging from about 1E13 atoms/cm$^2$ to about 1E14 atoms/cm$^2$ and at a energy ranging from about 100 keV to about 500 keV. This results in the well region 220 having a peak dopant concentration ranging from about 5E17 atoms/cm$^3$ to about 1E19 atoms/cm$^3$.

Located over the substrate 210 in the embodiment of FIG. 2 is a gate structure 230. The gate structure 230 includes a gate oxide 240 and a polysilicon gate electrode 250. The gate oxide 240 may comprise a number of different materials and stay within the scope of the present invention. For example, the gate oxide 240 may comprise silicon dioxide, or in an alternative embodiment comprise a high dielectric constant (K) material. In the illustrative embodiment of FIG. 2, however, the gate oxide 240 is a silicon dioxide layer having a thickness ranging from about 0.5 nm to about 5 nm.

Any one of a plurality of manufacturing techniques could be used to form the gate oxide 240. For example, the gate oxide 240 may be either grown or deposited. Additionally, the growth or deposition steps may require a significant number of different temperatures, pressures, gasses, flow rates, etc.

While the advantageous embodiment of FIG. 2 dictates that the polysilicon gate electrode 250 comprise standard polysilicon, other embodiments exist where the polysilicon gate electrode, or at least a portion thereof, comprises amorphous polysilicon. The amorphous polysilicon embodiment may be particularly useful when a substantially planar upper surface of the polysilicon gate electrode 250 is desired.

The deposition conditions for the polysilicon gate electrode 250 may vary, however, if the polysilicon gate electrode 250 were to comprise standard polysilicon, such as the instance in FIG. 2, the polysilicon gate electrode 250 could be deposited using a pressure ranging from about 100 torr to about 300 torr, a temperature ranging from about 620° C. to about 700° C., and a SiH$_4$ or Si$_2$H$_6$ gas flow ranging from about 50 sccm to about 150 sccm. If, however, amorphous polysilicon were desired, the amorphous polysilicon gate electrode could be deposited using a pressure ranging from about 100 torr to about 300 torr, a temperature ranging from about 450° C. to about 550° C., and a SiH$_4$ or Si$_2$H$_6$ gas flow ranging from about 100 sccm to about 300 sccm. In any instance, the polysilicon gate electrode 250 desirably has a thickness ranging from about 50 nm to about 150 nm.

The partially completed semiconductor device 200 illustrated in FIG. 2 further includes a protective layer 260 located over the polysilicon gate electrode 250, resulting in a capped polysilicon gate electrode. The protective layer 260, which may comprise silicon nitride among other materials, may have a thickness ranging from about 5 nm to about 50 nm. It is desirable for the protective layer 260 to have a thickness small enough to allow a dopant to easily penetrate therethrough, however, large enough to provide the sufficient amount of protection to the polysilicon gate electrode 250.

Optionally located over the protective layer 260 is a silicon dioxide layer 270. The optional silicon dioxide layer 270 is designed to help pattern the gate oxide 240, polysilicon gate electrode 250 and protective layer 260. With that said, those skilled in the art understand that the gate oxide 240, polysilicon gate electrode 250, protective layer 260 and optional silicon dioxide layer 270 were originally blanket deposited. Those blanket layers were subsequently patterned resulting in the gate oxide 240, polysilicon gate electrode 250, protective layer 260 and optional silicon dioxide layer 270 illustrated in FIG. 2. In one embodiment, the polysilicon gate electrode 250 and protective layer 260 are formed using a chemical vapor deposition (CVD) technique.

Figure 3:
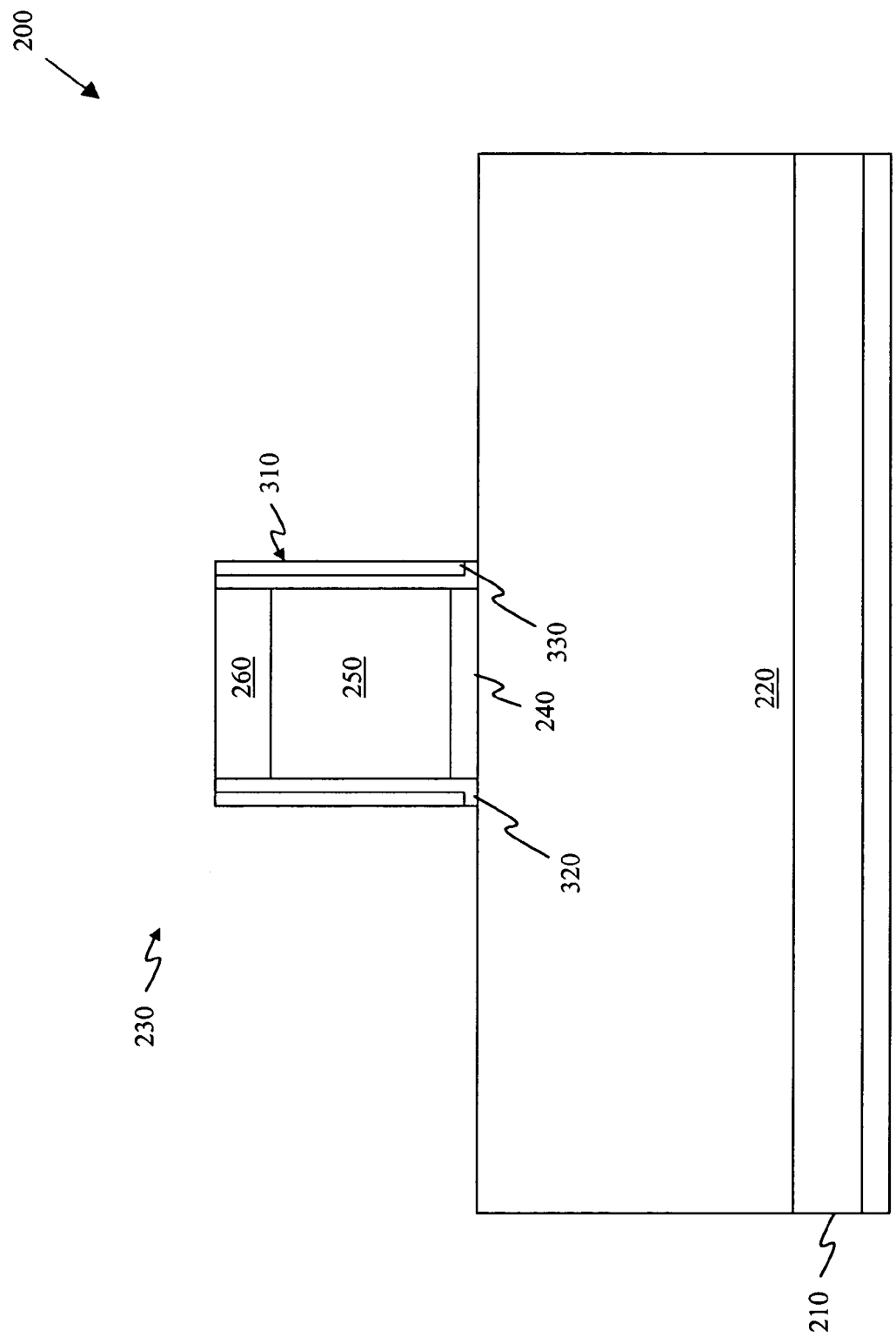
FIG. 3 illustrates a cross-sectional view of the partially completed semiconductor device illustrated in FIG. 2 after formation of a portion of gate sidewall spacers.

Turning briefly to FIG. 3 illustrated is a cross-sectional view of the partially completed semiconductor device 200 illustrated in FIG. 2 after formation of portions of gate sidewall spacers 310. The portions of the gate sidewall spacers 310 shown in FIG. 3 include an oxide layer 320 and an offset nitride spacer 330. The oxide layer 320, as compared to similar layers used in the prior art, is formed at least partially using a deposition process. In an exemplary process the oxide layer 320 is initially formed using a first deposition process, and then finished using a second oxidation process. The first deposition process allows the oxide layer 320 to form on the top and sidewalls of the protective layer 260. In an alternative embodiment the entire oxide layer 320 is deposited.

The offset nitride spacer 330 may comprise a standard silicon nitride spacer or a silicon nitride layer having carbon therein. If the offset nitride spacer 330 were to contain the carbon, the carbon might form from about 5% to about 10% of the layer. While the oxide layer 320 and the offset nitride spacer 330 are shown located only along the sides of the gate structure 230, those skilled in the art are aware that the layers were previously blanket formed and subsequently anisotropically etched to form the oxide layer 320 and the offset nitride spacer 330.

Figure 4:
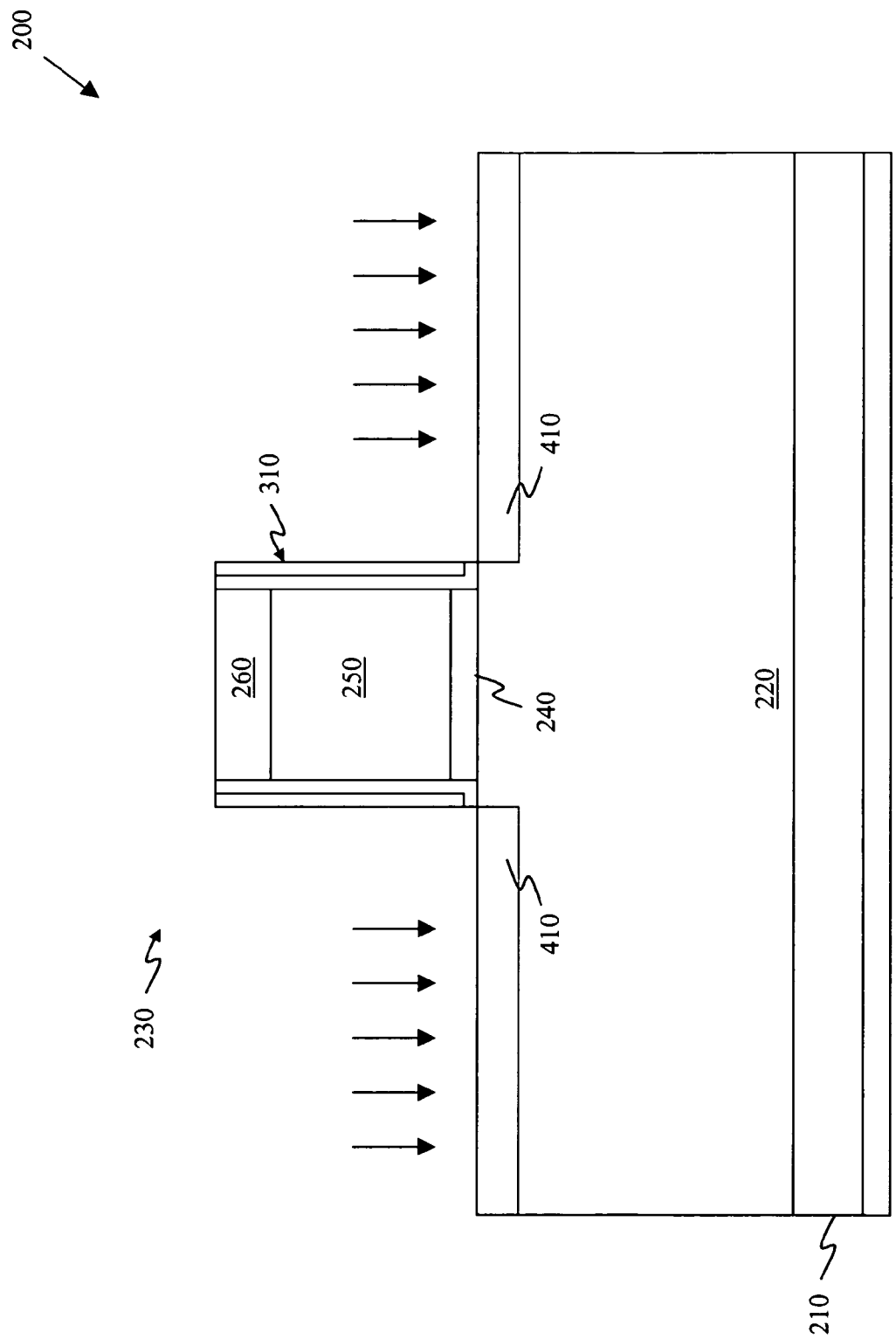
FIG. 4 illustrates a cross-sectional view of the partially completed semiconductor device illustrated in FIG. 3 after formation of lightly doped extension implants within the substrate.

Turning now to FIG. 4, illustrated is a cross-sectional view of the partially completed semiconductor device 200 illustrated in FIG. 3 after formation of lightly doped extension implants 410 within the substrate 210. The lightly doped extension implants 410 are conventionally formed and generally have a peak dopant concentration ranging from about 1E19 atoms/cm$^3$ to about 2E20 atoms/cm$^3$. As is standard in the industry, the lightly doped extension implants 410 have a dopant type opposite to that of the well region 220 they are located within. Accordingly, the lightly doped extension implants 410 are doped with a P-type dopant in the illustrative embodiment shown in FIG. 4.

Figure 5:
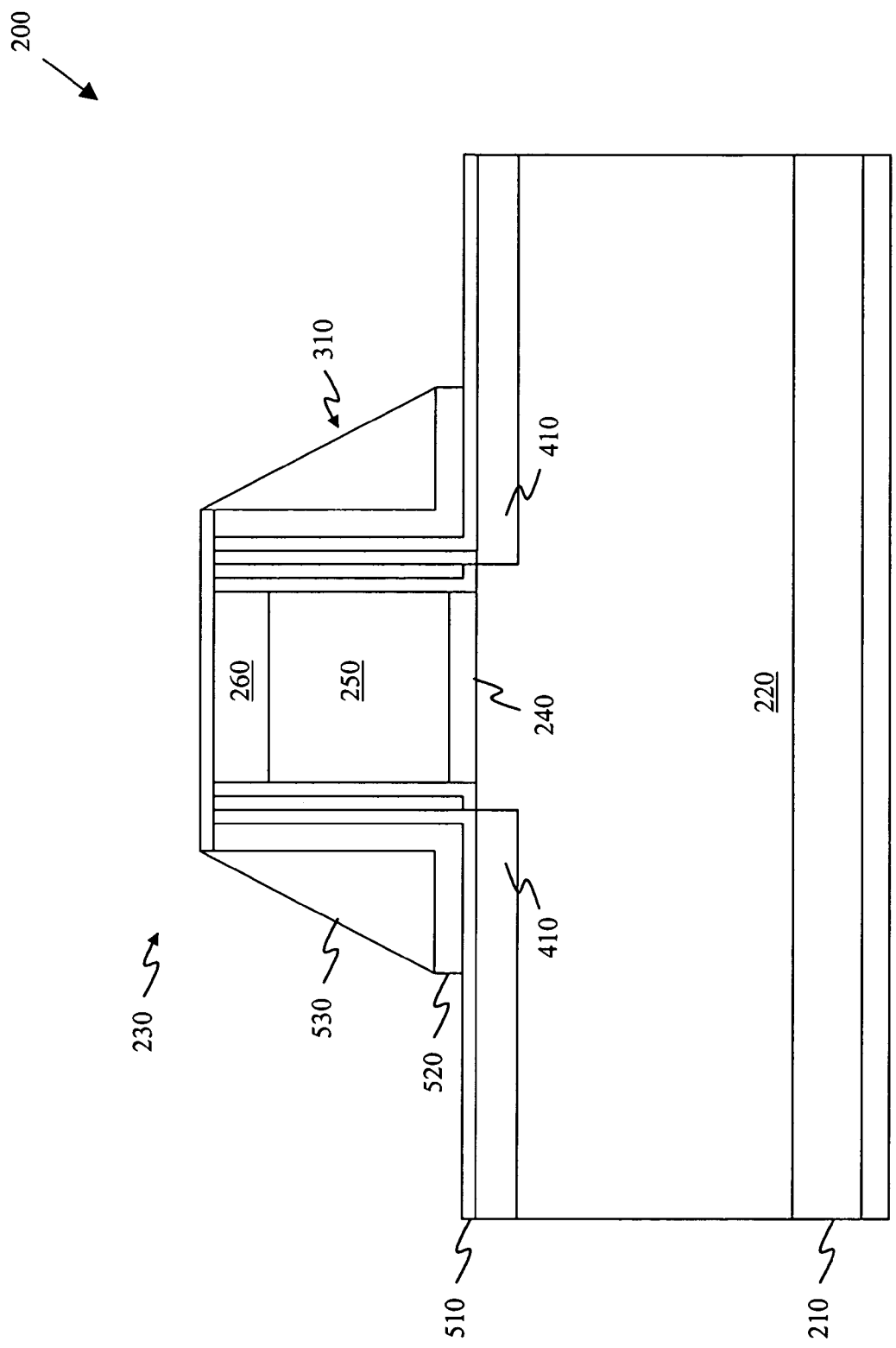
FIG. 5 illustrates a cross-sectional view of the partially completed semiconductor device illustrated in FIG. 4 after forming the remaining portions of the gate sidewall spacers.

Turning now to FIG. 5, illustrated is a cross-sectional view of the partially completed semiconductor device 200 illustrated in FIG. 4 after forming the remaining portions of the gate sidewall spacers 310. Particularly, a cap oxide 510, L-shaped nitride spacers 520 and sidewall oxides 530 complete the gate sidewall spacers 310. The cap oxide 510, among other purposes, has the job of preventing the L-shaped nitride spacers 520 from directly contacting the substrate 210. Most likely, the cap oxide 510 will be deposited over the partially completed semiconductor device 200 using a process similar to that used to form the oxide layer 320.

The L-shaped nitride spacers 520 may comprise any type of nitride, however, in an exemplary embodiment the L-shaped nitride spacers 520 comprise a nitride material that includes carbon. The carbon content, which may range from about 5% to about 10% of the L-shaped nitride spacers 520, is included within the L-shaped nitride spacers 520 to change the rate at which they etch. In the embodiment where the L-shaped nitride spacers 520 include carbon, the L-shaped nitride spacers 520 may be deposited using bis t-butylaminosilane (BTBAS) and ammonia (NH$_3$) precursors in a CVD reactor. Advantageously, the carbon causes the L-shaped nitride spacers 520 to etch at a slower rate than a traditional nitride layer. In an exemplary situation, after having been annealed using a temperature ranging from about 1000° C. to about 1100° C., the carbon causes the L-shaped nitride spacers 520 to have an etch selectivity of about 50:1 when compared to the traditional nitride layer.

The sidewall oxides 530 that are located over the L-shaped nitride spacers 520 are conventional. In the given embodiment of FIG. 5, the sidewall oxides 530 were blanket deposited and then subjected to an anisotropic etch. The resulting sidewall oxides 530 complete the gate sidewall spacers 310 illustrated in the embodiment of FIG. 5.

Figure 6:
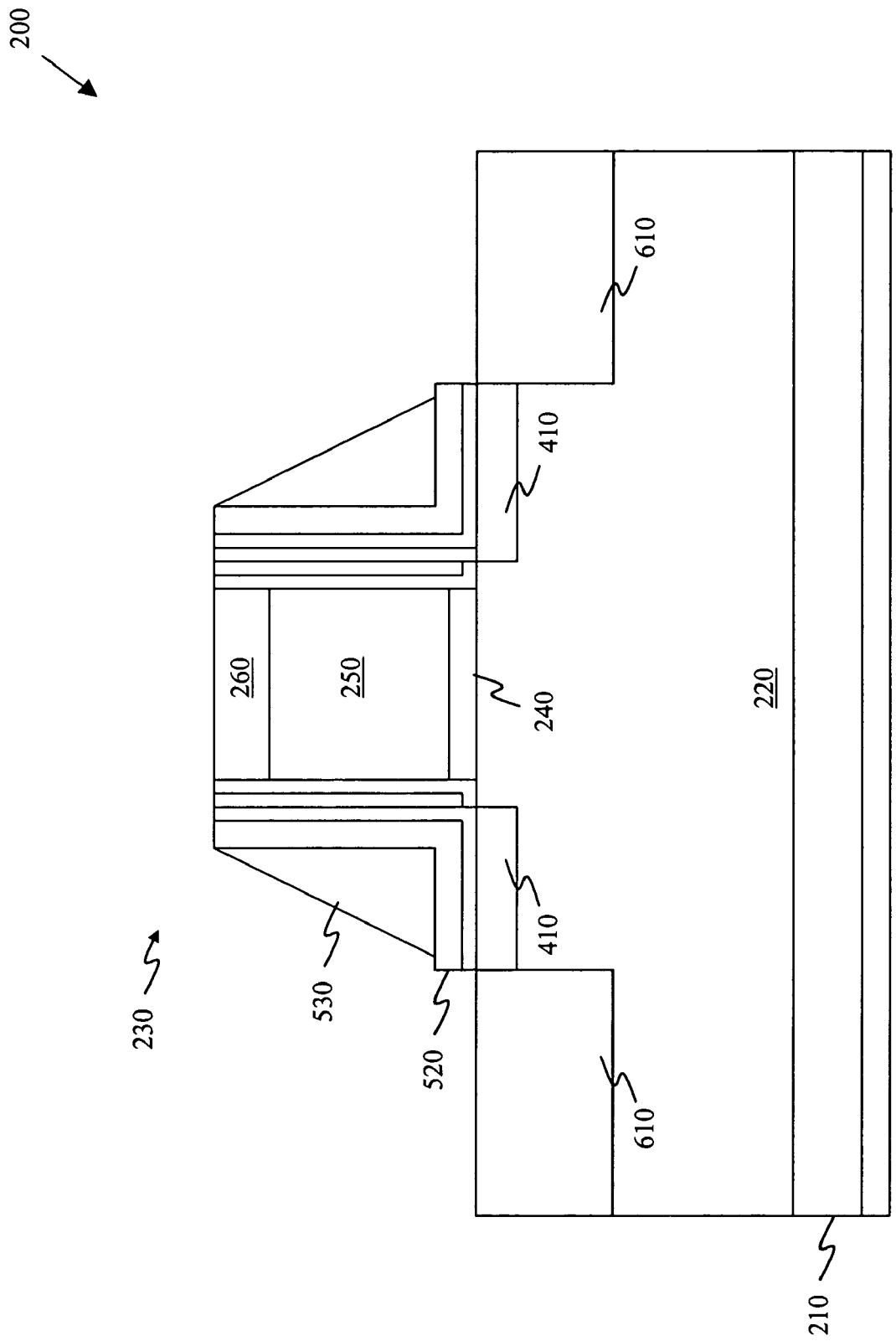
FIG. 6 illustrates a cross-sectional view of the partially completed semiconductor device illustrated in FIG. 5 after etching the cap oxide from the top of the substrate and top of the protective layer, as well as after formation of highly doped source/drain implants within the substrate.

Turning now to FIG. 6, illustrated is a cross-sectional view of the partially completed semiconductor device 200 illustrated in FIG. 5 after etching the cap oxide 510 from the top of the substrate 210 and top of the protective layer 260, as well as after formation of highly doped source/drain implants 610 within the substrate 210. Those skilled in the art understand the conventional processes that could be used to etch the cap oxide 510.

The formation of the highly doped source/drain implants 610 is also conventional. Generally the highly doped source/drain implants 610 have a peak dopant concentration ranging from about 1E18 atoms/cm$^3$ to about 1E21 atoms/cm$^3$. Also, the highly doped source/drain implants 610 should typically have a dopant type opposite to that of the well region 220 they are located within. Accordingly, in the illustrative embodiment shown in FIG. 6, the highly doped source/drain implants 610 are doped with a P-type dopant.

Figure 7:
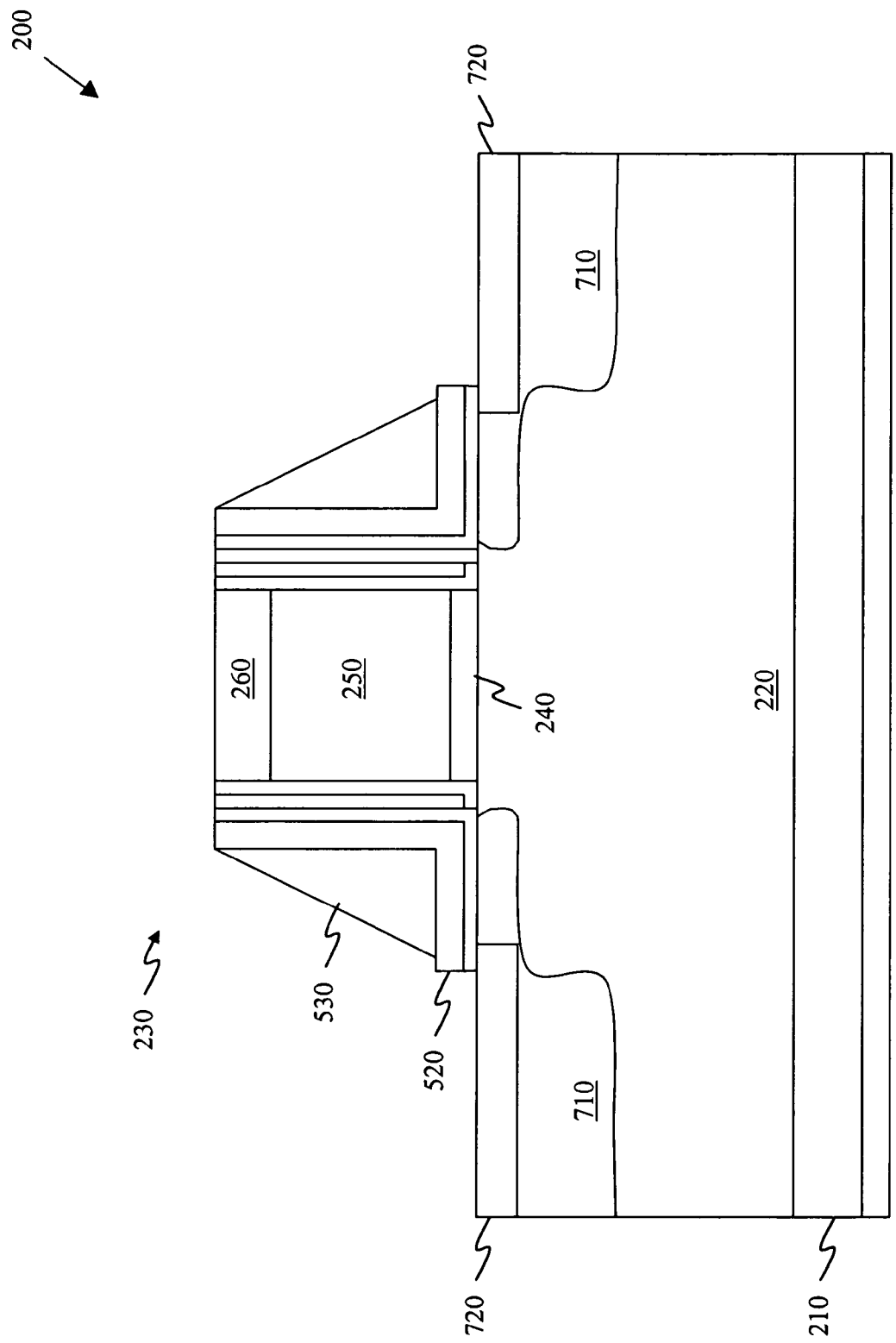
FIG. 7 illustrates a cross-sectional view of the partially completed semiconductor device illustrated in FIG. 6 after subjecting the semiconductor device to a standard source/drain anneal, thereby activating source/drain regions.

Turning now to FIG. 7, illustrated is a cross-sectional view of the partially completed semiconductor device 200 illustrated in FIG. 6 after subjecting the semiconductor device 200 to a standard source/drain anneal, thereby activating source/drain regions 710. It is believed that a source/drain anneal conducted at a temperature ranging from about 1000° C. to about 1100° C. and a time period ranging from about 1 second to about 5 seconds would be sufficient. It should be noted that other temperatures, times, and processes could be used to activate the source/drain regions 710.

Additionally illustrated in FIG. 7 is the formation of silicide blocking layers 720 over the exposed portions of the source/drain regions 710. The silicide blocking layers 720 are designed to protect the source/drain regions 710 from contacting a silicidation layer used in subsequent steps. The silicide blocking layers 720, in an exemplary embodiment, have a thickness ranging from about 2 nm to about 10 nm. Nevertheless, many thicknesses outside of the prescribed range are within the scope of the present invention.

A number of different manufacturing techniques could be used to manufacture the silicide blocking layers 720. While both techniques include one form or another of a dry oxidation, one technique is a high temperature oxidation and the other is a low temperature oxidation (e.g., a plasma oxidation process). As one would expect, each technique has its benefits and drawbacks. For instance, the low temperature oxidation technique may be conducted at a temperature ranging from about 200° C. to about 600° C. and has the benefit of not changing the doping profile of the source/drain regions 710. Unfortunately, the low temperature oxidation technique often involves oxygen radicals or energetic ions that form a thin oxide layer on the protective layer 260. Although the thickness of the oxide grown on the protective layer 260 should be less than the thickness grown on the source/drain regions 710, it must nonetheless subsequently be removed. At the same time a portion of the silicide blocking layer 720 must remain on the source/drain regions 710.

Alternatively, the higher temperature oxidation technique may be conducted with a rapid thermal oxidation (RTO) technique at a temperature ranging from about 900° C. to about 1000° C. and has the benefit of not forming the thin layer of oxide on the protective layer 260. Unfortunately, the higher temperature oxidation technique causes the doping profiles of the source/drain regions 710 to move. This can be accommodated in the transistor design, but it must be addressed at some point. Nonetheless, while the low and high oxidation techniques each have specific but different benefits, it is currently believed that the low temperature oxidation technique provides better results.

Figure 8:
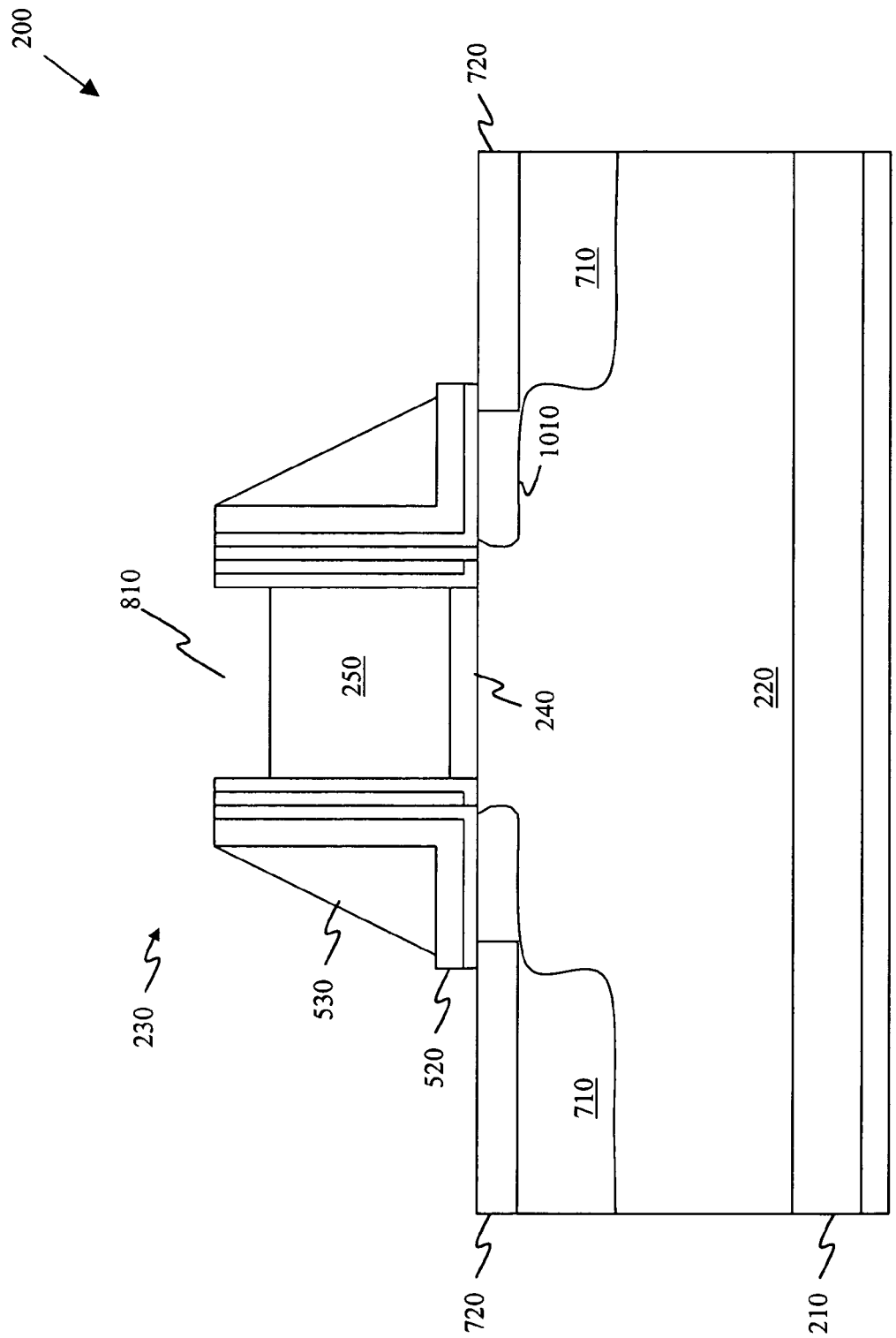
FIG. 8 illustrates a cross-sectional view of the partially completed semiconductor device illustrated in FIG. 7 after removing the protective layer from over the polysilicon gate electrode to form an opening.

Turning now to FIG. 8, illustrated is a cross-sectional view of the partially completed semiconductor device 200 illustrated in FIG. 7 after removing the protective layer 260 from over the polysilicon gate electrode 250 to form an opening 810. Unique to the present invention, the etchant used to remove the protective layer 260 does not substantially affect other structures or films. More specifically, the hot phosphoric acid etchant used to remove the protective layer 260 does not affect the L-shaped nitride spacer 520 and silicide blocking layer 720. Even though the protective layer 260 and the L-shaped nitride spacer 520 both comprise silicon nitride, the carbon content of the L-shaped nitride spacer 520 provides substantial protection from the etchant.

Figure 9:
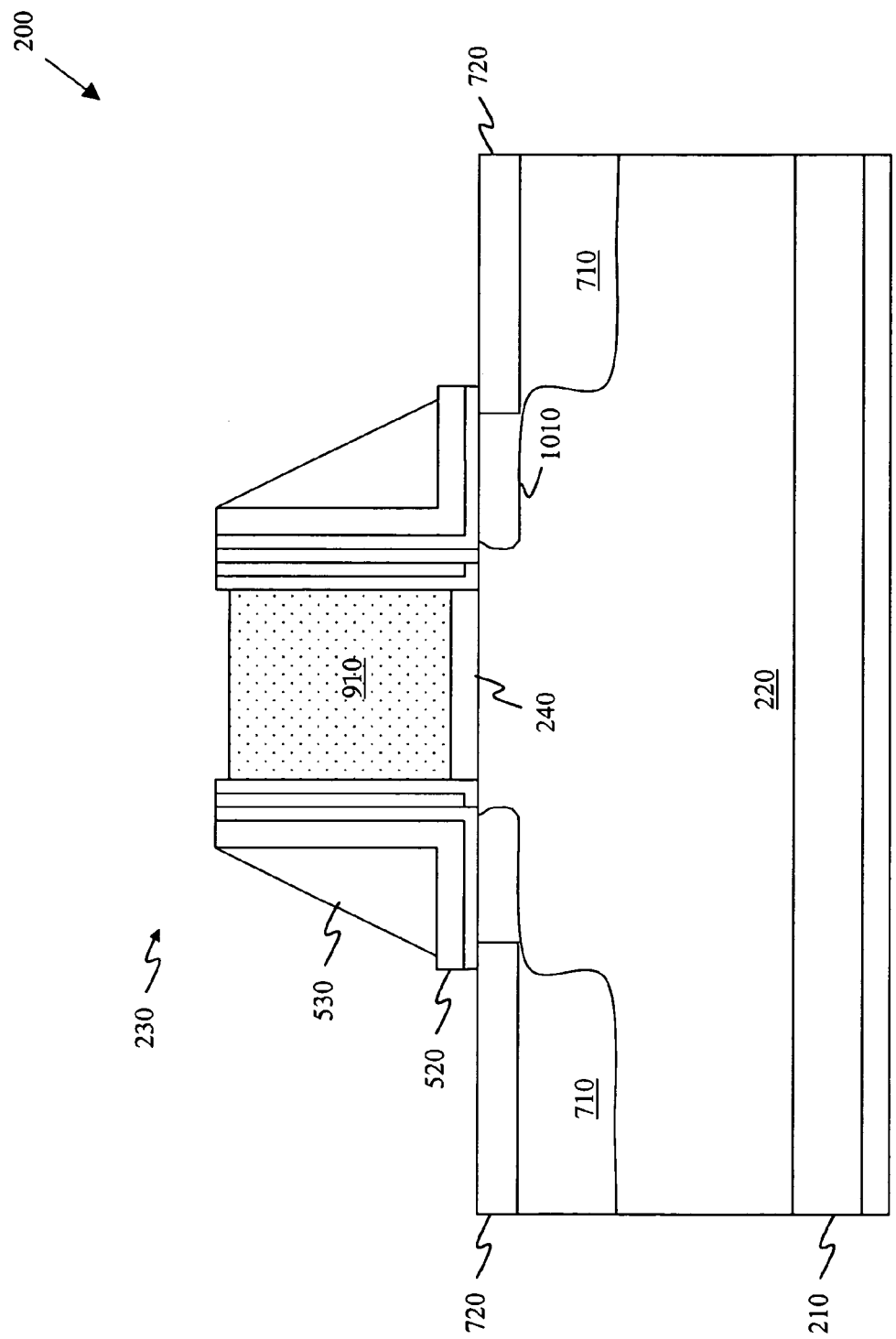
FIG. 9 illustrates a cross-sectional view of the partially completed semiconductor device illustrated in FIG. 8 after converting the polysilicon gate electrode to a silicided gate electrode.

Turning now to FIG. 9, illustrated is a cross-sectional view of the partially completed semiconductor device 200 illustrated in FIG. 8 after converting the polysilicon gate electrode 250 to a silicided gate electrode 910. Those skilled in the art understand the steps that might occur to form the silicided gate electrode 910. For instance, a blanket layer of nickel may be formed over the polysilicon gate electrode 250, the blanket layer of nickel being the silicidizing agent for the polysilicon gate electrode 250. The blanket layer of nickel and the polysilicon gate electrode 250 may then be subjected to a first rapid thermal anneal (RTA).

The first RTA is designed to convert the polysilicon gate electrode 250 to the silicided gate electrode 910. The annealing temperature depends on the silicide metal being used. For example, it is believed that the first RTA may be conducted at a temperature ranging from about 400° C. to about 600° C. and a time period ranging from about 10 second to about 100 seconds to accomplish the silicidation when nickel is used. It should be noted that other temperatures, times, and processes could be used.

In a preferred embodiment, the blanket layer of nickel fully silicidizes the polysilicon gate electrode 250. As it takes approximately 1 nm of nickel to fully silicidize approximately 1.8 nm of polysilicon, the thickness of the blanket layer of nickel should be at least 56% of the thickness of the polysilicon gate electrode 250. To be comfortable, however, it is suggested that the thickness of the layer of nickel should be at least 60% of the thickness of the polysilicon gate electrode 250. Thus, where the thickness of the polysilicon gate electrode 250 ranges from about 50 nm to about 150 nm, as described above, the thickness of the blanket layer of nickel should range from approximately 30 nm to about 90 nm. It should also be noted that the blanket layer of silicidation material may comprise a number of different metals or combinations of metals while staying within the scope of the present invention. After fully silicidizing the polysilicon gate electrode 250, any remaining unreacted metal materials, which happens to be nickel in this embodiment, may be removed. The silicide does not form on the source/drain region 710 at this time because of the silicide blocking layer 720.

Figure 10:
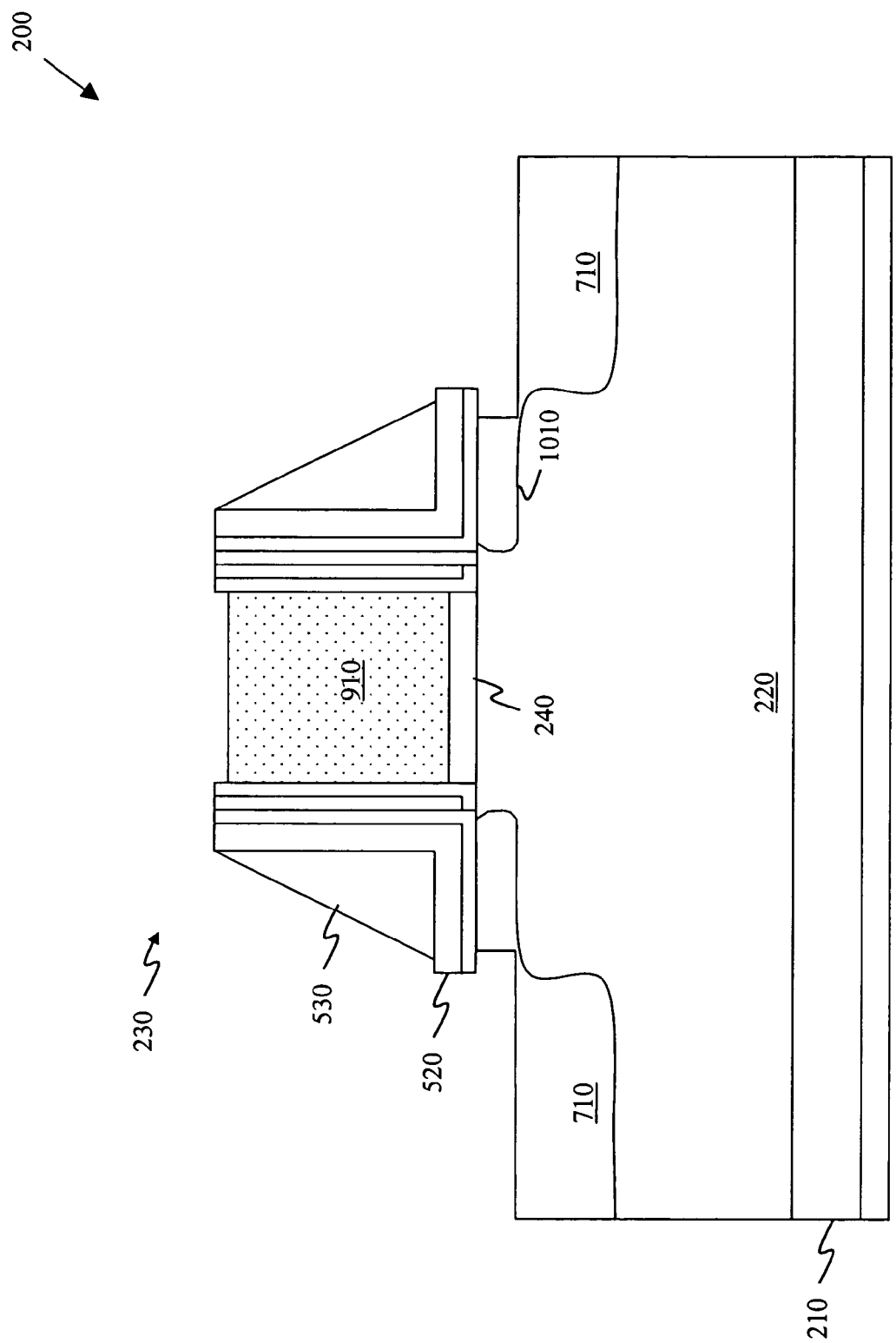
FIG. 10 illustrates a cross-sectional view of the partially completed semiconductor device illustrated in FIG. 9 after removing the silicide blocking layers.

Turning now to FIG. 10, illustrated is a cross-sectional view of the partially completed semiconductor device 200 illustrated in FIG. 9 after removing the silicide blocking layers 720. In an exemplary embodiment a conventional oxide etch could be used to remove these portions. As illustrated, the conventional oxide etch etches into the substrate 210. In the particular embodiment of FIG. 10, the conventional oxide etch also etches under the gate sidewall spacers 310.

Figure 11:
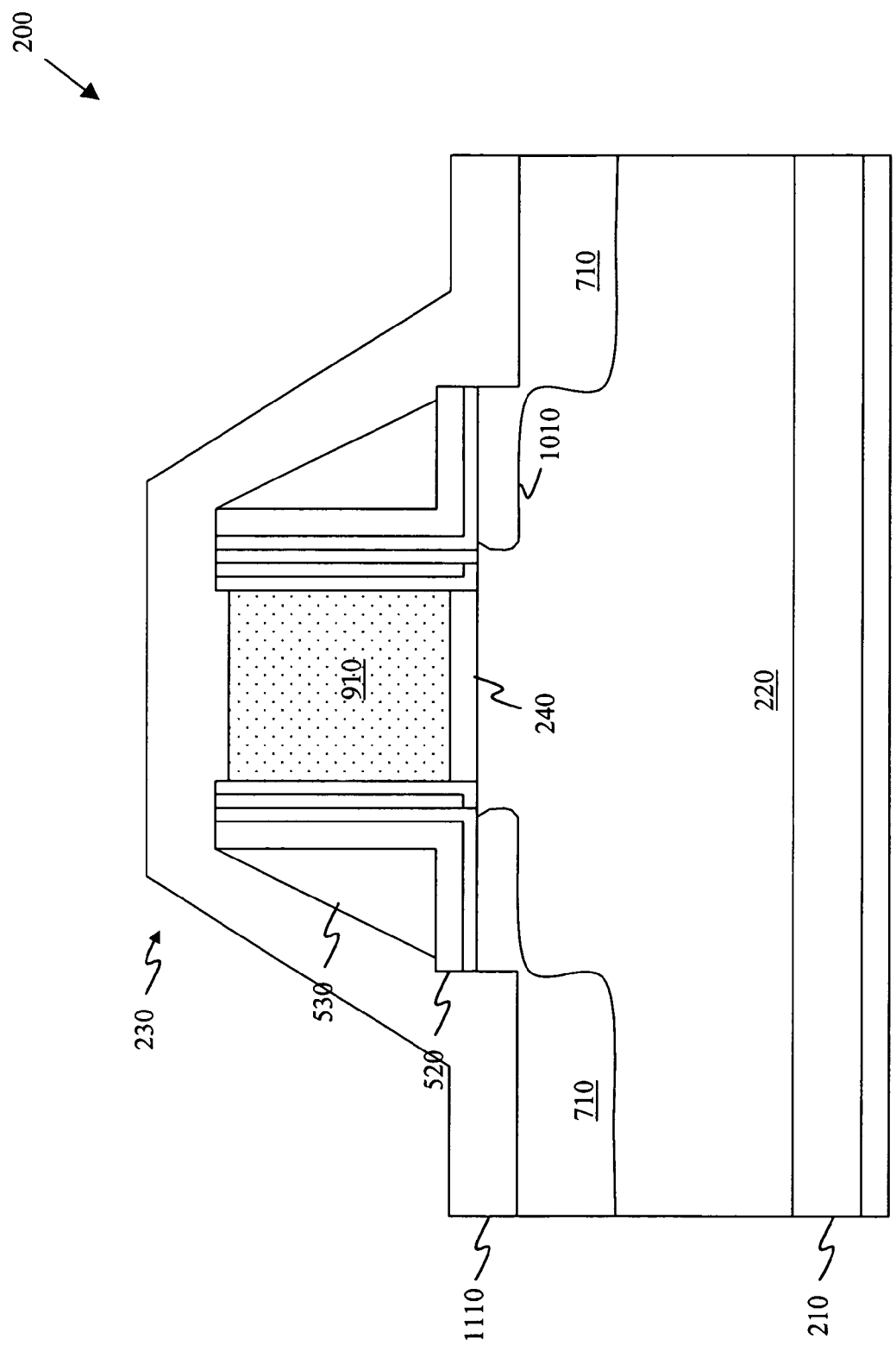
FIG. 11 illustrates a cross-sectional view of the partially completed semiconductor device illustrated in FIG. 10 after depositing a source/drain silicidation layer over the entire surface of the partially completed semiconductor device.

Turning now to FIG. 11, illustrated is a cross-sectional view of the partially completed semiconductor device 200 illustrated in FIG. 10 after depositing a source/drain silicidation layer 1110 over the entire surface of the partially completed semiconductor device 200. The source/drain silicidation layer 1110 in the embodiment shown in FIG. 11 happens to be a thin nickel layer, however, other materials that react with silicon to form a silicide could easily be used. The source/drain silicidation layer 1110 of FIG. 11 was conventionally deposited to a thickness ranging from about 4 nm to about 20 nm.

Figure 12:
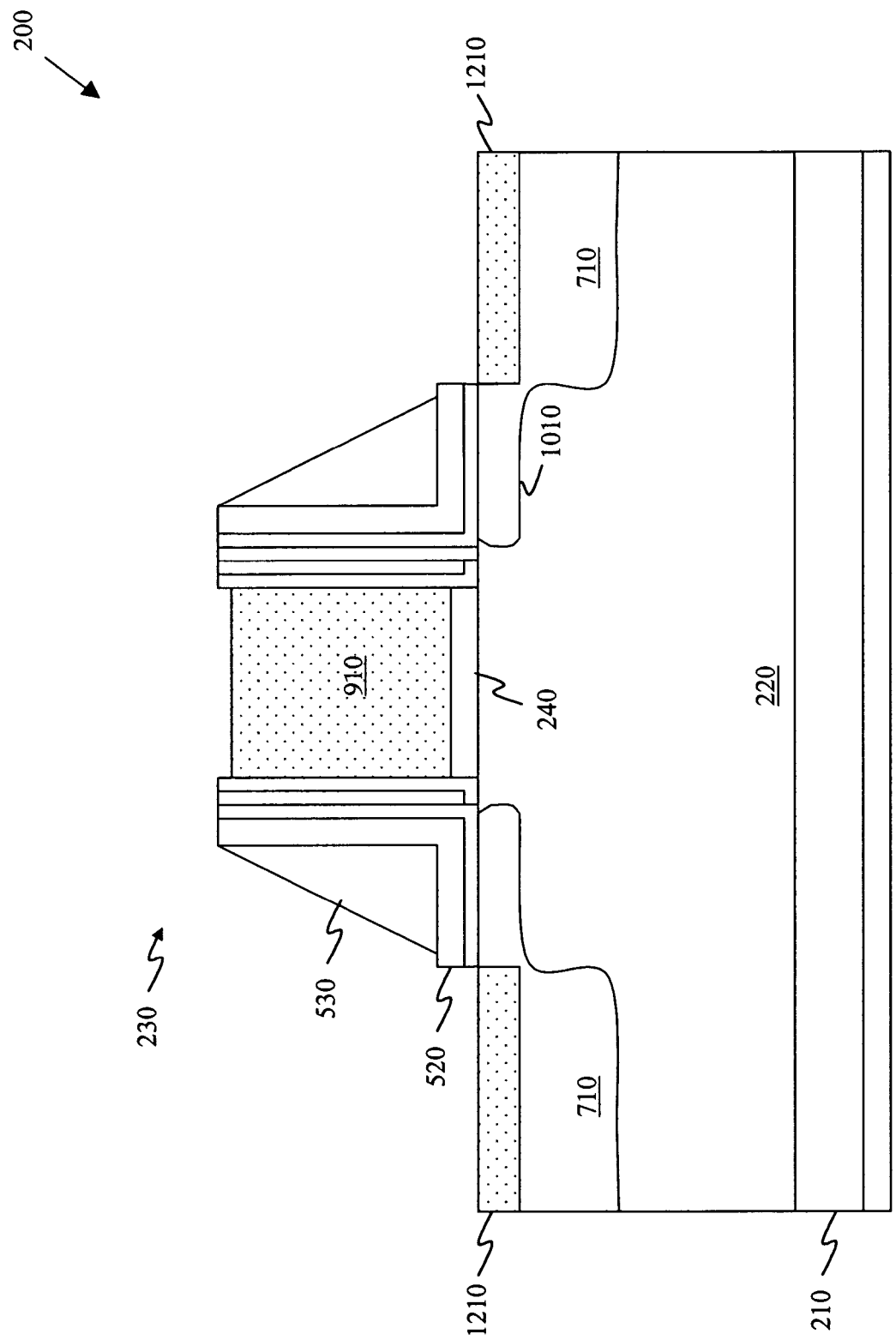
FIG. 12 illustrates a cross-sectional view of the partially completed semiconductor device illustrated in FIG. 11 after subjecting it to a second RTA process and wet etch.

Turning now to FIG. 12, illustrated is a cross-sectional view of the partially completed semiconductor device 200 illustrated in FIG. 11 after subjecting it to a second RTA process. This second RTA process attempts to cause the source/drain silicidation layer 1110 to react with the silicon of the source/drain regions 710 to form silicided source/drain contact regions 1210. In the instance where the source/drain silicidation layer 1110 comprises nickel, the second RTA process causes the nickel to react with the silicon to form a nickel silicide.

The second RTA process may be conducted using a variety of different temperatures and times. Nonetheless, it is believed that the second RTA process, in an exemplary embodiment, should be conducted in a rapid thermal processing tool at a temperature ranging from about 400° C. to about 600° C. for a time period ranging from about 5 seconds to about 60 seconds. The specific temperature and time period are typically based, however, on the ability to form the silicided source/drain contact regions 1210 to a desired depth, as well as the silicide materials selected.

After completing the silicided source/drain contact regions 1210, the partially completed semiconductor device 200 is subjected to a selective removal process. For instance, in one embodiment of the invention the device could be subjected to an etch recipe consisting of sulfuric acid ($H_2SO_4$), hydrogen peroxide ($H_2O_2$) and water ($H_2O$). This specific etch recipe has a high degree of selectivity and could easily remove any remaining portions of the source/drain silicidation layer 1110. Thereafter the manufacture of the partially completed semiconductor device 200 would continue in a conventional manner, optimally resulting in a device similar to the semiconductor device 100 illustrated in FIG. 1.

It should be noted that the exact order of the steps illustrated with respect to FIGS. 2–12 may change depending on the process flow. Additionally, various other steps could be added to the description of FIGS. 2–12. For instance, in a different embodiment, a selective thin epitaxial silicon layer may be deposited just prior to the formation of the silicide blocking layers 720. One of the purposes of this step is to provide a sacrificial silicon layer to compensate the silicon consumed during the formation of the silicide blocking layers 720. This, in effect, would minimize the silicon recess shown in FIG. 10. Other variations may also exist.

The method of manufacturing the semiconductor device as discussed with respect to FIGS. 2–12 provides many benefits over the prior art methods. First, and possibly most important, it separates the formation of the silicided gate electrode 910 and silicided source/drain contact regions 1210 into different steps. Advantageously, this allows the depth of the silicided source/drain contact regions 1210 to be independent of the thickness of the silicided gate electrode 910. The decoupling of the two steps is achieved by taking advantage of the chemical selectivity of thin films to certain etch chemistries. Accordingly, CMP is not needed as it is in the prior art methods capable of decoupling the steps. As such, the method of the present invention is applicable to devices having different step heights, whether by design or process variation. The CMP technique of the prior art is not capable of accepting such variations in step heights.

Figure 13:
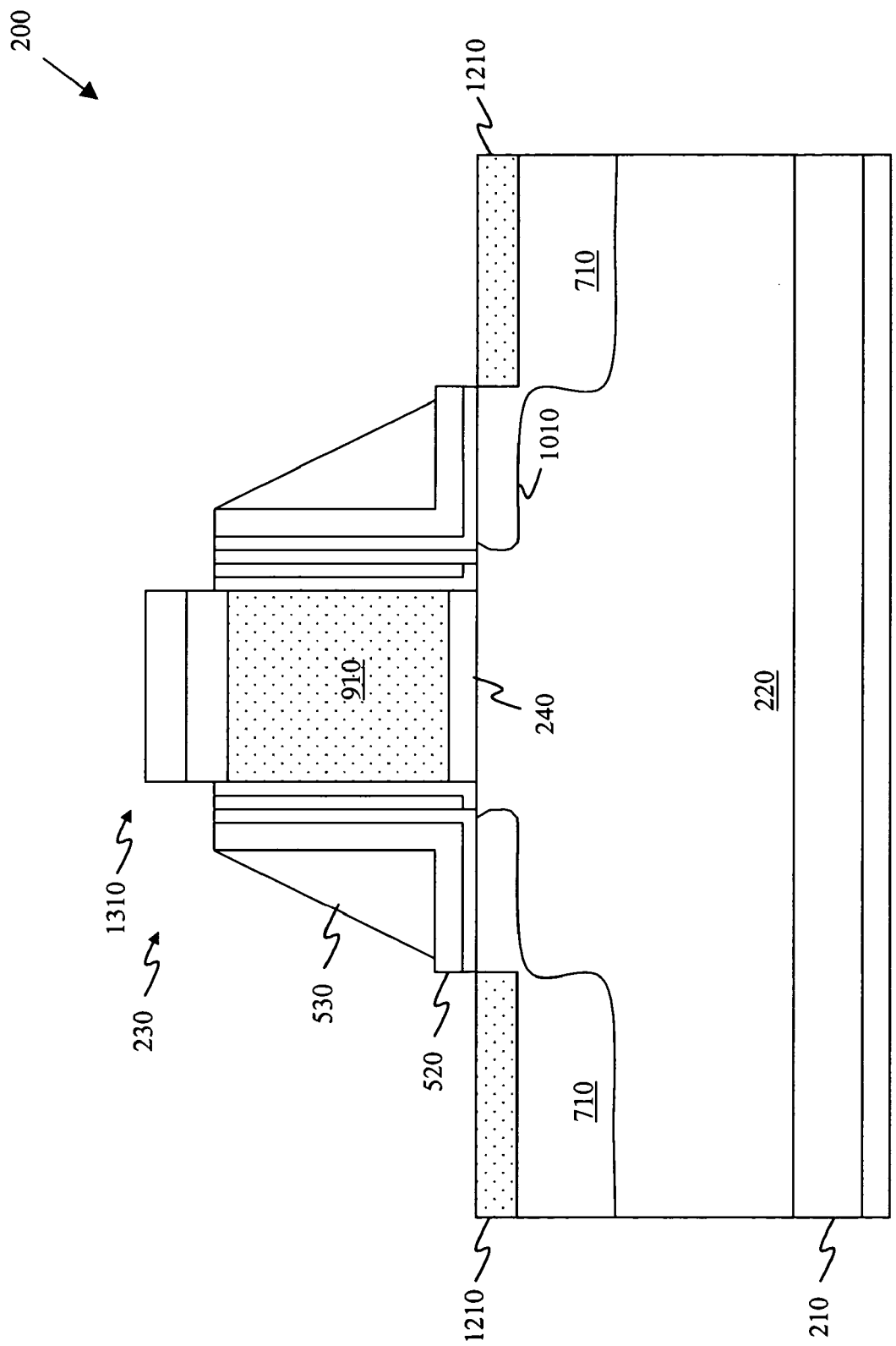
FIG. 13 illustrates a cross-sectional view of an embodiment of the present invention wherein the method of manufacturing semiconductor devices as discussed with respect to FIGS. 2–12 is applied to fabricate a high performance stacked capacitor.

Turning briefly to FIG. 13, illustrated is a cross-sectional view of an embodiment of the present invention wherein the method of manufacturing semiconductor devices as discussed with respect to FIGS. 2–12 is applied to fabricate a high performance stacked capacitor 1310. Using the process sequences described above, the first electrode (or the bottom electrode) of the capacitor 1310 can be fully silicided. Subsequently, the insulator over the first electrode and the second electrode can be formed using conventional methods. Due to the elimination of the poly depletion at the interface between the first electrode and gate oxide by full silicidation, the performance of the stacked capacitors is enhanced. More details pertaining to the stacked capacitor may be obtained from U.S. patent application Ser. No. 10/722,013, entitled "A CAPACITOR FORMED ON A RECRYSTALIZED POLYSILICON LAYER AND A METHOD OF MANUFACTURE THEREFOR" by Jiong-Ping Lu, et al., which is incorporated herein by reference.

Figure 14:
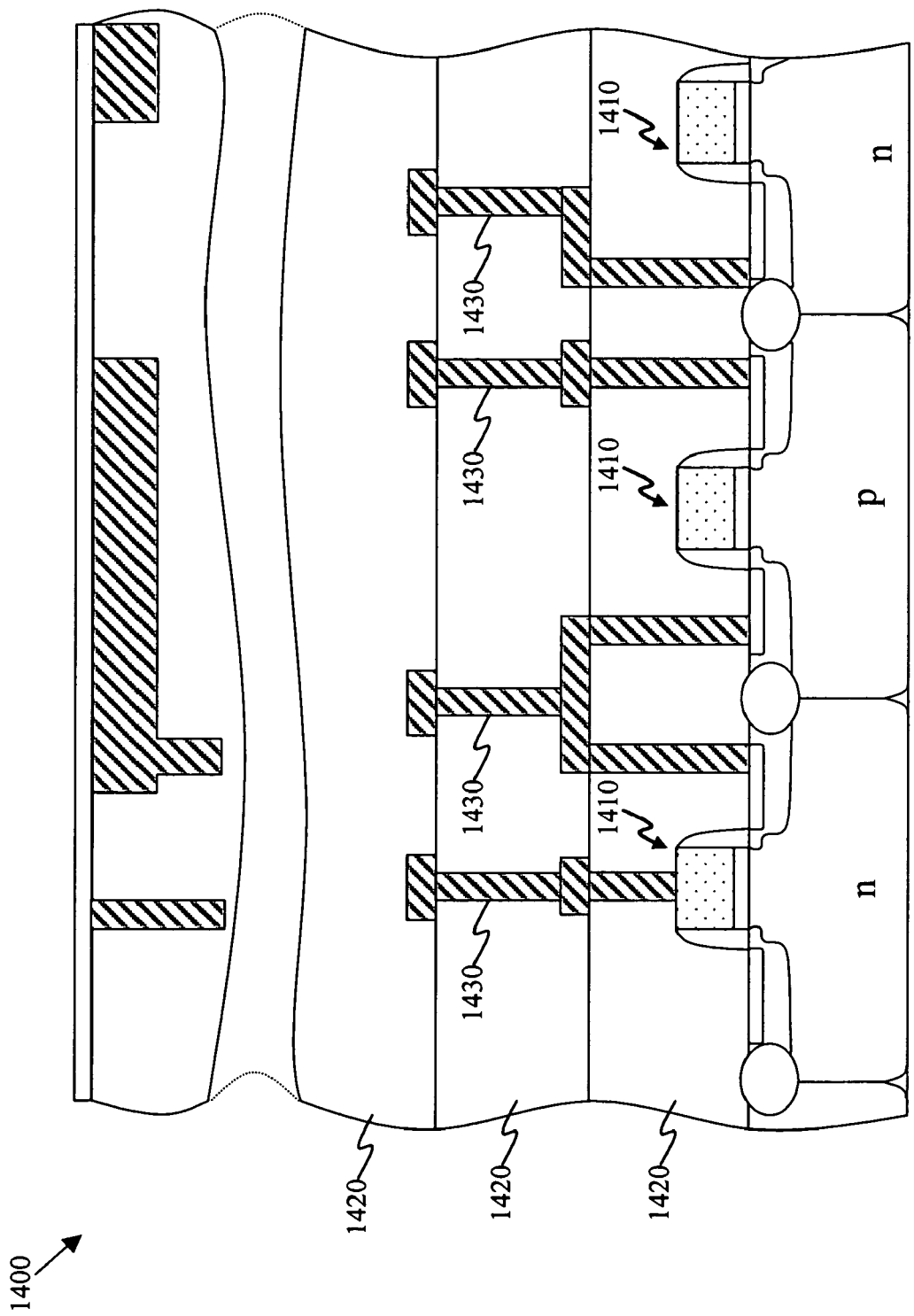
FIG. 14 illustrates an exemplary cross-sectional view of an integrated circuit (IC) incorporating devices constructed according to the principles of the present invention.

Referring finally to FIG. 14, illustrated is an exemplary cross-sectional view of an integrated circuit (IC) 1400 incorporating devices 1410 constructed according to the principles of the present invention. The IC 1400 may include devices, such as transistors used to form CMOS devices, BiCMOS devices, Bipolar devices, as well as capacitors or other types of devices. The IC 1400 may further include passive devices, such as inductors or resistors, or it may also include optical devices or optoelectronic devices. Those skilled in the art are familiar with these various types of devices and their manufacture. In the particular embodiment illustrated in FIG. 14, the IC 1400 includes the devices 1410 having dielectric layers 1420 located thereover. Additionally, interconnect structures 1430 are located within the dielectric layers 1420 to interconnect various devices, thus, forming the operational integrated circuit 1400.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:
   forming a protective layer over a polysilicon gate electrode located over a substrate to provide a capped polysilcon gate electrode;
   forming source/drain regions in said substrate proximate said capped polysilcon gate electrode;
   removing said protective layer using an etchant;
   siliciding said polysilicon gate electrode to form a silicided gate electrode, wherein a silicide blocking layer is formed over said source/drain regions prior to said siliciding said polysilicon gate electrode and using an oxidation process; and siliciding said source/drain regions after siliciding said polysilicon gate electrode.

2. The method as recited in claim 1 wherein said oxidation process is a dry oxidation process.

3. The method as recited in claim 1 wherein said oxidation process is a low temperature radical oxidation or plasma oxidation process.

4. The method as recited in claim 1 wherein said silicide blocking layer has a thickness ranging from about 2 nm to about 10 nm.

5. The method as recited in claim 1 wherein said protective layer is a silicon nitride protective layer.

6. The method as recited in claim 5 further including forming a sidewall spacer adjacent said capped polysilicon gate electrode tat includes a nitride layer wherein said nitride layer is of a different chemical composition than said silicon nitride protective layer.

7. The method as recited in claim 6 wherein said nitride layer has from about 5% to about 10% carbon content.

8. The method as recited in claim 1 wherein said silicided source/drain regions extend under at least a portion of gate sidewall spacers located adjacent said silicided gate electrode.

9. The method as recited in claim 1 wherein the protective layer has a thickness ranging from about 5 nm to about 50 nm.

10. A method for manufacturing an integrated circuit, comprising:

forming semiconductor devices over a substrate, including;

forming a protective layer over a polysilicon gate electrode located over said substrate to provide a capped polysilicon gate electrode;

forming source/drain regions in said substrate proximate said capped polysilicon gate electrode;

removing said protective layer using an etchant;

siliciding said polysilicon gate electrode to form a silicided gate electrode, wherein a silicided blocking layer is formed over source/drain regions prior to said siliciding said polysilicon gate electrode and using an oxidation process; and siliciding said source/drain regions after siliciding said polysilicon gate electrode; and forming interconnects within dielectric layers located over said substrate for electrically contacting said semiconductor devices.

11. The method as recited in claim 10 wherein said oxidation process is a dry oxidation process.

12. The method as recited in claim 10 wherein said oxidation process is a low temperature radical oxidation or plasma oxidation process.

13. The method as recited in claim 10 wherein said silicided blocking layer has a thickness ranging from about 2 nm to about 10 nm.

14. The method as recited in claim 10 wherein said protective layer is a silicon nitride protective layer.

15. The method as recited in claim 14 further including forming a sidewall spacer adjacent said capped polysilicon gate electrode that includes a nitride layer wherein said nitride layer is of a different chemical composition than said silicon nitride protective layer.

16. The method as recited in claim 15 wherein said nitride layer has from about 5% to about 10% carbon content.

17. The method as recited in claim 14 wherein said silicided source/drain regions extend under at least a portion of gate sidewall spacers located adjacent said polysilicon gate electrode.

18. The method as recited in claim 14 wherein the protective layer has a thickness ranging from about 5 nm to about 50 nm.

* * * * *